(12) United States Patent
Chua et al.

(10) Patent No.: US 7,812,421 B2
(45) Date of Patent: Oct. 12, 2010

(54) LIGHT EMITTING DEVICES WITH AN ELECTRICALLY ACTIVE TOP REFLECTOR CONTACT

(75) Inventors: Christopher L. Chua, San Jose, CA (US); Mark R. Teepe, Menlo Park, CA (US); Clifford Knollenberg, Fremont, CA (US); Zhihong Yang, Sunnyvale, CA (US)

(73) Assignee: Palo Also Research Center Incorporated, Palo Alto, CA (US)

( * ) Notice: Subject to any disclaimer, the term of this patent is extended or adjusted under 35 U.S.C. 154(b) by 186 days.

(21) Appl. No.: 11/962,861

(22) Filed: Dec. 21, 2007

(65) Prior Publication Data
US 2008/0144688 A1    Jun. 19, 2008

Related U.S. Application Data

(63) Continuation-in-part of application No. 11/516,333, filed on Sep. 6, 2006.

(51) Int. Cl.
*H01L 29/78* (2006.01)
(52) U.S. Cl. .......................... 257/432; 257/98; 438/27; 438/29; 438/65; 438/69
(58) Field of Classification Search ................ 257/98, 257/432; 438/27, 29, 65, 69
See application file for complete search history.

(56) References Cited

U.S. PATENT DOCUMENTS 7,078,735 B2 *   7/2006   Shono et al. .................. 257/98

\* cited by examiner

*Primary Examiner*—Fernando L Toledo
(74) *Attorney, Agent, or Firm*—Marger Johnson McCollom, P.C.

(57) ABSTRACT

According to one described embodiment, a light emitting device structure includes an epitaxial contact layer disposed on an active region of the light emitting device structure, a multi-layer reflector disposed at least partially on the epitaxial contact layer, and conductive contacts abutting the epitaxial contact layer, the multi-layer reflector enclosing the conductive contacts.

24 Claims, 5 Drawing Sheets

LIGHT EMITTING DEVICES WITH AN ELECTRICALLY ACTIVE TOP REFLECTOR CONTACT

CROSS-REFERENCE TO RELATED APPLICATIONS

This application is a continuation-in-part of U.S. application Ser. No. 11/516,333, which was filed on 6 Sep. 2006, and which is incorporated by reference in its entirety for all purposes.

BACKGROUND

This disclosure relates generally to light emitting devices. Particularly, this disclosure relates to a light emitting device with an electrically active top reflector contact.

The ability to efficiently extract light from light emitting device structures is always a key consideration in their design. For some light emitting devices, such as Ultra-Violet Light Emitting Diodes (UV LEDs), light is usually extracted from the wafer backside because one or more layers above the light-generating active layer are opaque or light-absorbing. It is therefore desirable to place a reflector above the top layers so light travelling upwards can be reflected downwards toward the bottom output. It is also important that the LED incorporate a top-side electrical contact so that flip-chipped arrays of closely spaced emitters can be formed. Unfortunately, conventional reflectors usually incorporate dielectrics that block electrical current.

DETAILED DESCRIPTION OF THE EMBODIMENTS

The presently described embodiments disclose device structures that have highly reflective top layers to enhance the light extraction efficiency of light emitting devices such as LEDs. According to the presently described embodiments, the light extraction efficiency of backside-emitting nitride LEDs can be significantly improved if such top contact layers are made highly reflecting—without significantly compromising their current spreading ability. This disclosure proposes device structures that provide such dual functionalities.

In one form of the presently described embodiments, an LED structure utilizes a mesh or grid pattern as a part of a top metal or conductive layer. The mesh or grid pattern allows current to be distributed across the top contact area while providing open spaces between the grids on which a highly reflective mirror can be formed. High reflectivity for the top layer is achieved by improving (e.g., optimizing) the relative fill factor of open areas to alloyed mesh contact areas. The alloyed mesh or grid pattern allows electrical current to be distributed across the entire top contact area.

In another form of the presently described embodiments, a reflector of an LED structure utilizes a dielectric layer followed by a metal layer. An electrical contact is provided between the annealed LED contacts and the metal layer of the reflector. Since the metal layer of the reflector may distribute electric current across the entire top contact area, the design of the metal contact regions may be relaxed, permitting non-grid or non-mesh contact designs. For example, isolated islands of contact metal may be surrounded by a sea of reflector dielectric material. This flexibility in the design of the metal contact regions allows for greater variation in the fill factor ratio, which for purposes of this disclosure is defined as the ratio of the area of the reflector regions to the area of the contact regions.

Figure 1:
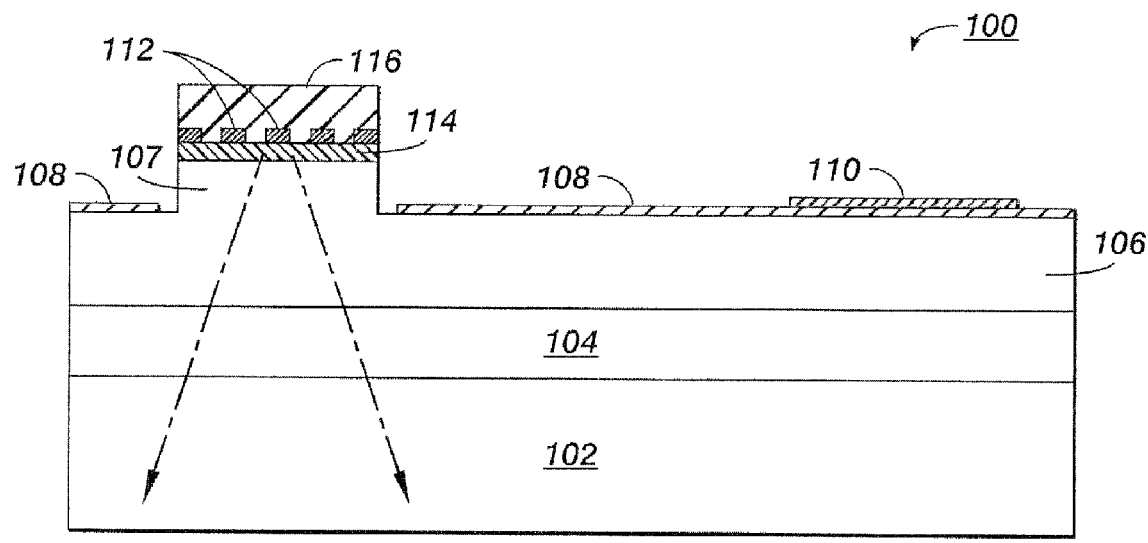
FIG. 1 is a cross-sectional diagram that illustrates an embodiment of an LED.

FIG. 1 is a cross-sectional diagram that illustrates an embodiment of an LED. Referring now to FIG. 1, a light emitting diode 100 includes a substrate layer 102 and a template layer 104. The substrate layer 102 may be formed of a variety of different materials, including sapphire. Likewise, the template layer 104 may be formed of a variety of different materials, including aluminum nitride or an alloy of aluminum gallium nitride.

A plurality of epitaxial layers comprises a UV light emitting diode, including, but not limited to: a light-emitting active region 107, an n-doped epitaxial layer 106, and a p-contact layer 114. The details of LED epitaxial layers such as epitaxial layers 106, 107, and 114 are known in the art (see, for example, U.S. Pat. Nos. 6,233,265 and 6,618,413, both of which are incorporated herein by reference) and so are not described here. In one embodiment, a conductive (or metal) contact or layer 112 comprises a layer of nickel (Ni) followed by gold (Au). The layer stack is then heated and made to alloy with an underlying GaN p-contact layer 114 to form an Ohmic p-contact. The n-contact metal 108 can be a stack comprising of titanium (T) followed by aluminum (Al). Like the p-contact, an Ohmic n-contact is formed by heating and alloying the n-contact metal 108 into an underlying n-doped epitaxial layer 106.

Notably, the metal layer 108 has an n-contact pad 110 formed thereon to facilitate device packaging. As shown, the p-contact metal or conductive layer 112 is provided with at least one aperture (e.g., a plurality of apertures) that defines a mesh pattern or grid. A reflector 116, aligned with the mesh pattern is also provided to the devices.

To form the device of FIG. 1, the conductive layer 112 is deposited on the epitaxial layer 114 such that the conductive layer has defined therein a contact area having a plurality of apertures. The conductive layer 112 may be formed of, for example, a metal or a conductive oxide. A reflector 116 is then formed on the metal conductive layer 112, the reflector being aligned with the plurality of apertures of the contact area. The reflector 116 may take a variety of forms but, in one form(s), can be a simple non-alloyed metal such as silver, aluminum or gold. The reflector 116 may also be comprised of a dielectric, such as $SiO_x$, $SiN_x$ or ITO, and a metal formation, such as a cap, to further enhance reflectivity. Alternatively, Distributed Bragg Reflectors (DBRs) consisting of alternating layers of dielectric pairs can be employed.

The reflectivity of the reflector 116 could be improved, e.g. optimized, by choosing appropriate thicknesses of reflector materials. For a 325 nm UV LED, for example, various reflector materials and thicknesses may be selected. The thickness of the reflector materials may vary as a function of the presence of, in one embodiment, an absorbing 20 nm thick GaN p-contact layer 114. This GaN top layer is considered by many to be essential for adequate electrical contacting.

Figure 2:
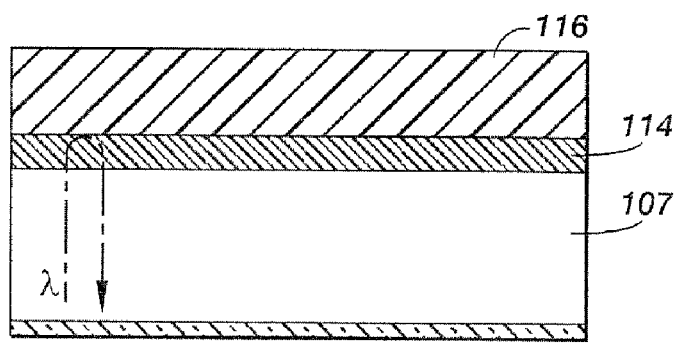
FIG. 2 is a simplified model used for reflectivity calculations for the LED illustrated in FIG. 1.

FIG. 2 is a simplified model for reflectivity calculations for a 325 nm UV LED such as the one illustrated in FIG. 1. As shown in FIG. 2, the 20 nm thick GaN p-contact layer 114 is disposed between the reflector 116 and the upper surface of the light-emitting active region 107.

Different reflector designs employing a variety of different materials can be used. For example, without a reflector, only about 11% of upward-directed light is reflected. A simple reflector 116 consisting of an unalloyed metal capable of reflecting light of the wavelength emitted by the LED active region such as Al, Ag, or Au significantly increases reflectivity. Such a metallic reflector can be easily evaporated and has the additional advantage of being electrically conducting, so current distribution is improved. A 300 nm layer of Au, for example, boosts the reflectivity at the reflector region to about 56%.

The performance of simple metal reflectors can be improved by inserting a dielectric material transparent to the wavelength of light emitted by the LED active region such as $SiO_2$, $ZrO_2$, $HfO_2$, $Si_3N_4$, $TiO_2$, $Ta_2O_5$ or $Al_2O_3$ between the top metal of the reflector 116 and the GaN surface of the p-contact layer 114. The percentages of elements in the dielectrics are nominal values. The actual compositions can vary from the nominal values depending on material deposition methods and conditions. For these reasons, $SiO_2$ is sometimes labeled as $SiO_x$, $Si_3N_4$ is sometimes labeled as $Si_xN_y$, and so on. For example, a 0.4-lambda thick $SiO_2$ (54.8 nm thick for λ=325 nm LEDs) followed by a 300 nm thick Au increases the reflectivity to about 90%. The preferred dielectric material and its corresponding optimized layer thickness would differ from material to material and from design to design, so it will have to be determined for each device structure chosen. A transparent conductive film such as Indium Tin Oxide (ITO) or Zinc Oxide (ZNO) can be used in place of the dielectric to improve current spreading.

Distributed Bragg Reflectors (DBRs) consisting of pairs of alternating materials such as $SiO_2$, $ZrO_2$, $HfO_2$, $Si_3N_4$, $TiO_2$, $Ta_2O_5$ or $Al_2O_3$ can also be employed. Again, the percentages of elements in the dielectrics are nominal values. The actual compositions can vary from the nominal values depending on material deposition methods and conditions. A 5-pair quarter-wave thick $SiO_2/ZrO_2$ DBR produces a reflectivity of about 55% at the design wavelength of 325 nm. The GaN contact layer 114 shifts the reflectivity spectrum of the DBR so the maximum reflectivity occurs at a slightly longer wavelength than the design wavelength. Increasing the thickness of each layer in every pair to 0.28-λ shifts the reflectivity spectrum so a maximum reflectivity of 65% results at the design wavelength of 325 nm.

Other types of reflectors 116 can be designed. For example, a metal cap can be placed above a dielectric DBR, or an optical phase shifting dielectric layer can be placed between the GaN contact layer and a DBR. It should also be understood that if reflectivity of the reflector 116 is selected to be sufficiently high, the light emitting device contemplated herein may take the form of a surface-emitting laser. Table 1, which appears below this paragraph, summarizes the reflectivity results for the reflector designs that were discussed above.

TABLE 1

| Reflector Design | Reflectivity at λ = 325 nm |
| --- | --- |
| No reflector | 11% |
| 300 nm-thick Au | 56% |
| 0.4λ-thick $SiO_2$/300 nm Au | 90% |
| 5 pairs 0.25λ-thick $SiO_2/ZrO_2$ DBR | 55% |
| 5 pairs 0.28λ-thick $SiO_2/ZrO_2$ DBR | 65% |

Figure 3:
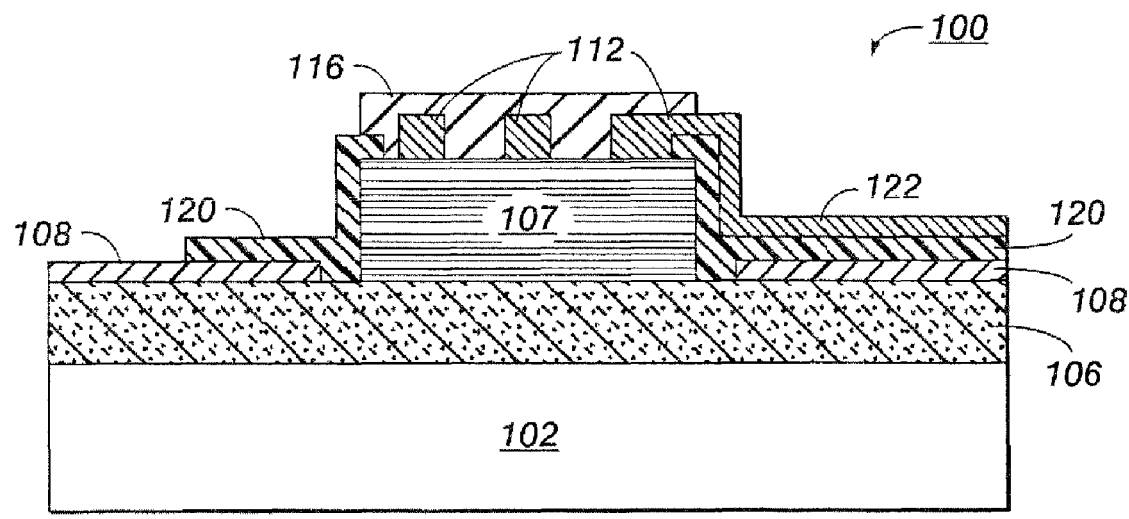
FIG. 3 is a cross-sectional diagram that further illustrates the LED of FIG. 1.

FIG. 3 is a cross-sectional diagram that further illustrates the LED 100 of FIG. 1. Many of the elements illustrated in FIG. 1 are also shown in FIG. 3. For convenience, a description of these common elements will not be repeated here. Also for convenience, the template layer 104 and the GaN p-contact layer 114 of FIG. 1 are not shown in FIG. 3.

In FIG. 3, the mesh or grid-shaped conductive layer 112 is shown as being electrically connected to a p-contact pad 122, which is in a region adjacent to the LED active region 107. This lateral electrical connection is employed because oftentimes an electrical connection through the reflector 116 is not assured. Additionally, a dielectric layer 120 is employed to prevent electrical shorting between the p-contact pad 122 and the n-contact layer 108.

In another form of the presently described embodiments, methods and structures are presented for improving the specific reflector design that uses a dielectric layer followed by a metal cap. As can be seen in Table 1, the reflector design that uses a layer combination of 0.4λ-thick $SiO_2$ followed by a 300 nm layer of Au offered the best reflectivity (up to 90%).

It is also conceivable that other materials may be used instead. For instance, the $SiO_2$ layer may be replaced with other dielectric materials transparent to the wavelength of light emitted by the LED active region such as $ZrO_2$, $HfO_2$, $Si_3N_4$, $TiO_2$, $Ta_2O_5$ or $Al_2O_3$. Additionally, in the case of UV LEDs, the Au film may be replaced with other metals that exhibit high reflectivity to UV light such as Al, Ag, or Rh. The optimal thicknesses of the reflector layers are likely to change as other materials are substituted for $SiO_2$ and Au.

The excellent reflectivity provided by dielectric/metal design and the ease of deposition when compared with the multiple layer configuration of DBR mirrors, makes this a preferred choice for forming a top reflector on LEDs. However, this reflector design should be used in combination with annealed metal contacts that provide an ohmic contact to the LED active region 107. According to presently described embodiments, the dielectric/metal reflector design is improved by providing an electrical contact between the annealed metal contacts and the metal layer of the reflector 116. This simplifies the delivery of current to the contacts while preserving the characteristics of the reflector 116 on the top surface of the LED.

Figure 4:
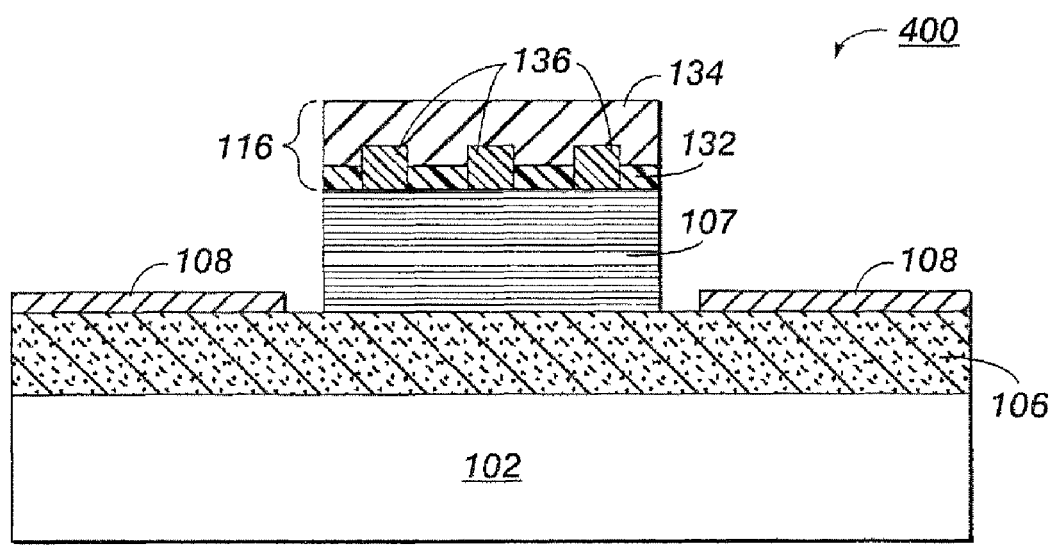
FIG. 4 is a cross-sectional diagram that illustrates an alternative embodiment of an LED.

FIG. 4 is a cross-sectional diagram that illustrates an alternative embodiment of an LED 400. Many of the elements illustrated in FIG. 1 are also shown in FIG. 4. For convenience, a description of these common elements will not be repeated here. Also for convenience, the template layer 104 and the GaN p-contact layer 114 of FIG. 1 are not shown in FIG. 3.

Referring to FIG. 4, the reflector 116 includes a dielectric layer 132 and a conductive layer 134 disposed on the dielectric layer. Thus, the reflector 116 can achieve the excellent reflectivity characteristics as indicated, for example, by the third row of Table 1. Additionally, annealed metal contacts 136 penetrate the dielectric layer 132 to contact the top surface of the LED active region 107. The upper portions of the annealed metal contacts 136 are covered by the conductive layer 134. Therefore, an electrical contact exists between the annealed metal contacts 136 and the conductive or metal layer 134 of the reflector.

Arranging the metal contacts 136 in the manner shown in FIG. 4 permits electrical contact to be established from the top surface of the metal layer 134 rather than from an adjacent electrical contact region as seen in FIG. 3, which provides denser LED packing on a chip because valuable chip real estate is not taken up by a lateral contact line and contact electrode placed to the side of the LED. Additionally, because the conductive layer 134 of the LED 400 does not extend over the n-contact metal 108, there is no need for the dielectric layer 120 as shown in FIG. 3 to prevent electrical shorts. Making electrical contact from the top surface of the LED also improves compatibility with flip-chip packaging processes, reduces the line resistance, and enhances heat extraction from the LED active region.

Figure 5:
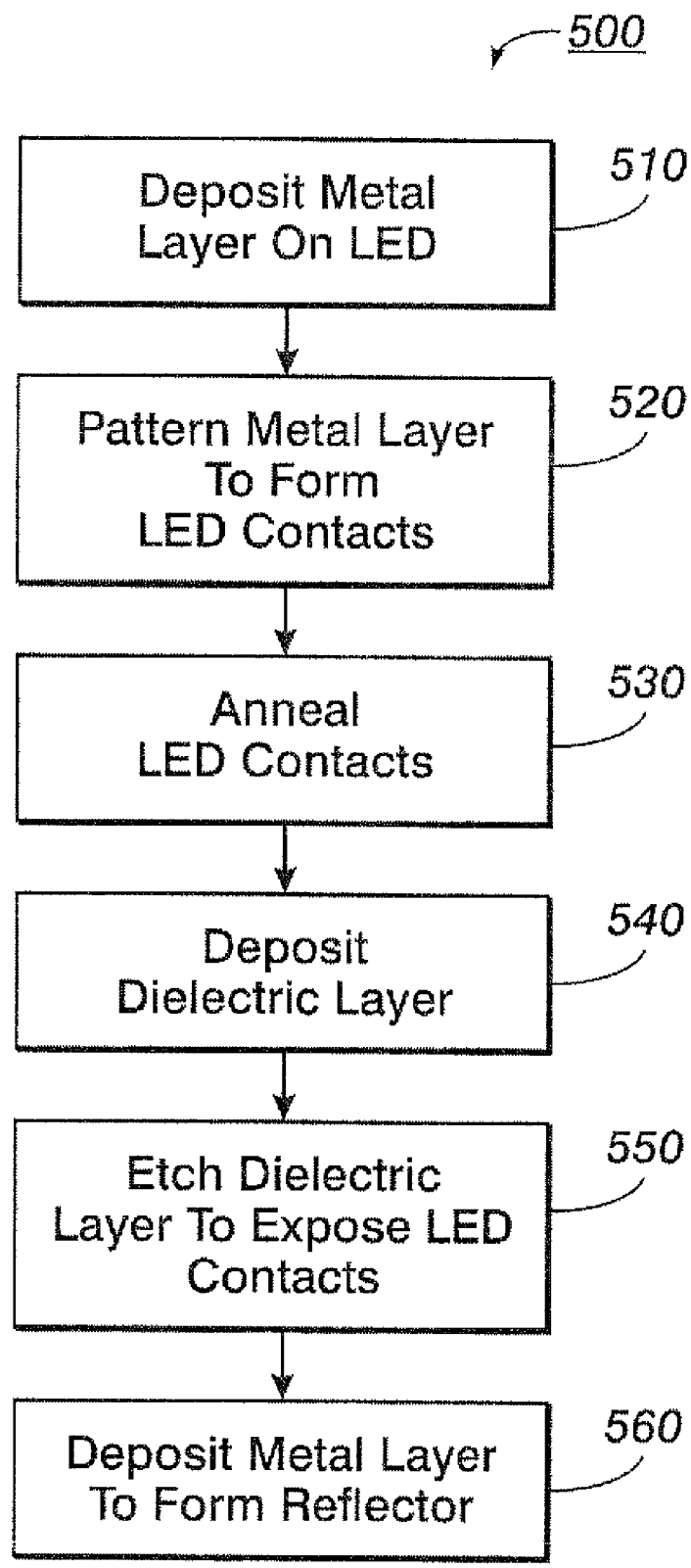
FIGS. 5 and 6 are flow diagrams illustrating some processes included in embodiments of methods of fabricating the LED reflector illustrated in FIG. 4.
Figure 6:
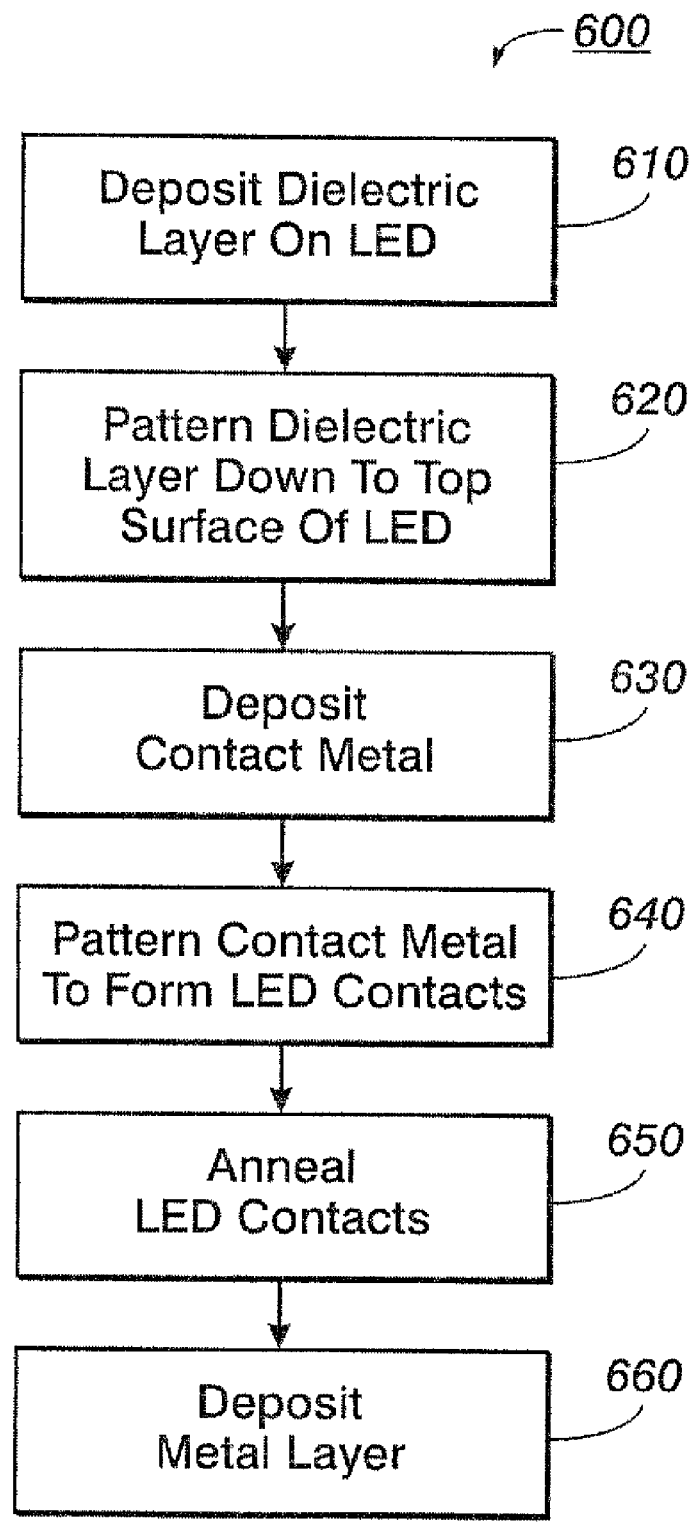

FIGS. 5 and 6 are flow diagrams illustrating some processes included in embodiments of methods of fabricating the LED reflector illustrated in FIG. 4. Referring to FIG. 5, a method 500 begins with the process 510 of depositing a metal layer on a LED active region. Next, the metal layer is patterned to form the conductive LED contacts in process 520. The LED contacts are annealed in process 530, after which the dielectric layer is deposited on the resulting structure in process 540. The dielectric layer is then etched in an etchback process 550 until the upper surfaces of the LED contacts are exposed. Next, in process 560, another metal layer, corresponding to the conductive layer 134 of FIG. 4, is deposited on the dielectric layer and the LED contacts.

As an alternative to method 500, method 600 of FIG. 6 begins with depositing a dielectric layer on the LED active region in process 610. Next, in process 620, the dielectric layer is patterned down to a top surface of the LED active region, and in process 630, a contact metal layer is deposited on the patterned dielectric layer. In process 640, the contact metal layer is patterned such that regions of dielectric material are disposed between regions of contact metal, creating the desired pattern of LED contacts on the LED active region. The LED contacts are annealed in process 650, and another metal layer corresponding to the conductive layer 134 of FIG. 4 is deposited on the dielectric layer and the LED contacts in process 660. The various available processes for depositing, etching, patterning, and annealing material layers are well known to those of skill in the art and will not be described in additional detail here.

The structures and methods according to the latter-described embodiments simplify the electrical contacting process while permitting light reflection from the top contact. As opposed to the embodiments that utilize the mesh or grid shaped contacts, the latter-described embodiments give greater latitude in the design of the contact regions as they need not be connected to one another in the plane of the contact because they are connected by posts to the conductive layer 134 of the reflector 116.

Figure 7A:
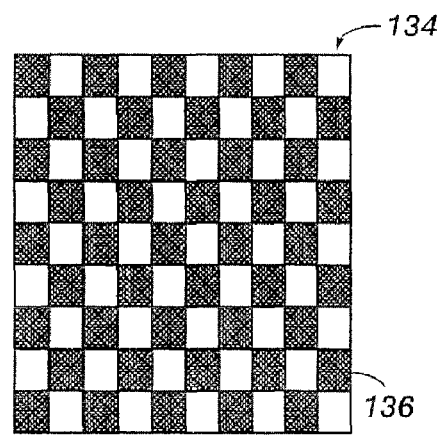
FIGS. 7A, 7B, and 7C are schematic top-view diagrams of example reflectors that illustrate a few of the embodiments in which the fill factor ratio can be modified.
Figure 7B:
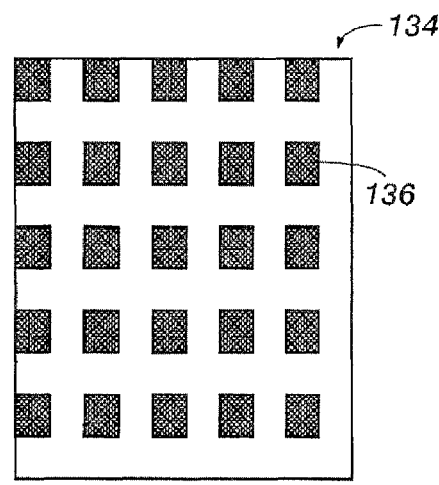
Figure 7C:
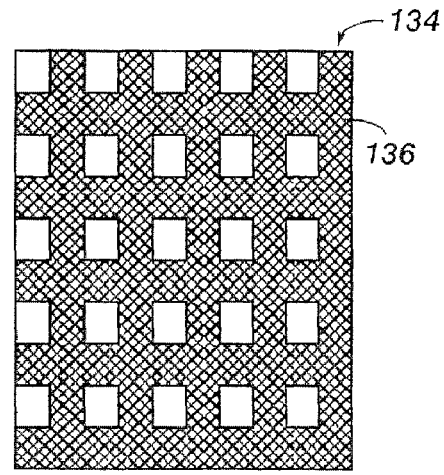

Because the latter-described embodiments give greater flexibility in the design of the contact regions, the contact regions may be arranged in any number of ways to achieve different fill factor ratios. FIGS. 7A, 7B, and 7C are schematic top-view diagrams of example reflectors that illustrate a few of the embodiments in which the fill factor ratio can be modified. In each of the FIGS. 7A, 7B, and 7C, the clear regions within the extent of the conductive layer 134 represent areas that are reflective regions of the reflector 116, while the crosshatched regions represent the contact regions 136 of the reflector 116. Accordingly, each of the reflectors 116 illustrated in FIGS. 7A, 7B, and 7C have fill factor ratios of substantially 1:1, 3:1, and 1:3, respectively. Of course, many other fill factor ratios can be achieved using different patterns or feature dimension for the contact regions 136 of the reflector 116.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A light emitting device structure comprising:
an epitaxial contact layer disposed on an active region of the light emitting device structure;
a multi-layer reflector disposed at least partially on the epitaxial contact layer; and
conductive contacts abutting the epitaxial contact layer, the multi-layer reflector enclosing the conductive contacts, the reflector and the conductive contacts being of different materials.

2. The light emitting device structure of claim 1, the multi-layer reflector comprising:
a dielectric layer abutting the epitaxial contact layer; and
a conductive layer disposed on the dielectric layer, the conductive contacts electrically connected to each other by the conductive layer.

3. The light emitting device structure of claim 2, wherein upper surfaces of the conductive contacts abut the conductive layer.

4. The light emitting device structure of claim 2, the conductive layer comprising a metal.

5. The light emitting device structure of claim 4, the metal selected from the group consisting of Au, Al, Ag, and Rh.

6. The light emitting device structure of claim 2, the dielectric layer comprising at least one layer selected from the group consisting of a $SiO_2$ layer, a $ZrO_2$ layer, a $HfO_2$ layer, a $Si_3N_4$ layer, a layer, a $Ta_2O_5$ layer, and a $Al_2O_3$ layer.

7. The light emitting device structure of claim 2, the conductive layer comprising a Au layer, the dielectric layer comprising a $SiO_2$ layer.

8. The light emitting device structure of claim 2, wherein the conductive contacts abutting the epitaxial layer comprise a mesh structure capable of distributing electrical current laterally across the epitaxial contact layer.

9. The light emitting device structure of claim 2, wherein the conductive layer is capable of distributing electrical current to isolated conductive contacts spread across the epitaxial contact layer.

10. The light emitting device structure of claim 1, wherein the light emitting device structure constitutes a Light Emitting Diode (LED).

11. The light emitting device structure of claim 8, wherein the light emitting device structure constitutes an Ultra-Violet LED.

12. The light emitting device structure of claim 1, wherein the light emitting device structure constitutes a surface-emitting laser.

13. A light emitting device comprising:
a substrate layer;
a template layer disposed on the substrate layer;
a light generating active layer disposed on the template layer, the light generating active layer having an epitaxial structure;

a contact layer disposed on the light generating active layer, the contact layer having the epitaxial structure;

a material layer disposed on the contact layer;

a conductive layer disposed on the material layer; and annealed conductive contacts that extend in a substantially vertical direction to penetrate the material layer, the annealed conductive contacts abutting the contact layer and the conductive layer, the annealed conductive contacts and the contact layer being of different materials.

14. The light emitting device of claim 13, wherein the conductive layer comprises a metal.

15. The light emitting device of claim 14, the metal comprising at least one selected from the group consisting of Ag, Al, Au, and Rh.

16. The light emitting device of claim 13, the material layer comprising a dielectric layer, the dielectric layer including at least one selected from the group consisting of $SiO_x$, $Si_xN_y$, $ZrO_x$, $HfO_x$, $TiO_x$, $Ta_xO_y$, and $Al_xO_y$.

17. The light emitting device of claim 13, the material layer comprising a transparent conductive film, the transparent conductive film including at least one selected from the group consisting of Indium Tin Oxide (ITO) and Zinc Oxide (ZnO).

18. The light emitting device of claim 13, wherein the annealed conductive contacts form a grid structure capable of distributing electrical current laterally across the epitaxial contact layer.

19. The light emitting device of claim 13, wherein the conductive layer is capable of distributing electrical current to isolated conductive contacts spread across the epitaxial contact layer.

20. A method of fabricating a reflector on a light emitting device, the method comprising:

forming contacts on an epitaxial contact layer of the light emitting device, the contacts having spaces there between;

forming a dielectric pattern on the epitaxial contact layer, the dielectric pattern at least partially occupying the spaces between the contacts; and forming a conductive layer on the dielectric layer and on the contacts, the conductive layer abutting at least a top surface of the contacts the conductive layer and the contacts being of different materials.

21. The method of claim 20, wherein forming contacts on the epitaxial layer comprises:

depositing a metal layer on the epitaxial contact layer of the light emitting device;

patterning the metal layer to form the contacts; and annealing the contacts.

22. The method of claim 20, wherein forming the dielectric pattern on the epitaxial contact layer comprises:

depositing a dielectric layer on the epitaxial contact layer; and etching selected portions of the dielectric layer down to the top surface of the epitaxial contact layer.

23. The method of claim 22, wherein forming contacts on the epitaxial layer comprises:

depositing a metal layer on the epitaxial layer and the dielectric pattern;

etching the metal layer down to an upper surface of the dielectric pattern to form the contacts; and annealing the contacts.

24. The method of claim 22, wherein forming contacts on the epitaxial layer and the conductive layer on the dielectric layer comprises:

depositing a metal layer on the epitaxial layer and the dielectric pattern; and annealing the contacts.

* * * * *